(12) United States Patent
Kim et al.

(10) Patent No.: US 9,093,378 B2
(45) Date of Patent: Jul. 28, 2015

(54) METHOD FOR FORMING PATTERNS OF SEMICONDUCTOR DEVICE USING SADP PROCESS

(71) Applicant: SAMSUNG ELECTRONICS CO., LTD., Suwon-si, Gyeonggi-do (KR)

(72) Inventors: Tae-Soo Kim, Seoul (KR); Yong-Min Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/841,037

(22) Filed: Mar. 15, 2013

(65) Prior Publication Data

US 2014/0273441 A1 Sep. 18, 2014

(51) Int. Cl.
*H01L 21/308* (2006.01)
*H01L 21/283* (2006.01)
*H01L 21/033* (2006.01)
*H01L 21/311* (2006.01)
*H01L 23/522* (2006.01)
*H01L 49/02* (2006.01)

(52) U.S. Cl.
CPC .......... *H01L 21/283* (2013.01); *H01L 21/0337* (2013.01); *H01L 21/31144* (2013.01); *H01L 23/5223* (2013.01); *H01L 28/60* (2013.01)

(58) Field of Classification Search
USPC .......................................................... 438/666
See application file for complete search history.

(56) References Cited

U.S. PATENT DOCUMENTS

| 4,859,616 | A | 8/1989 | Losehand et al. |
| 6,133,144 | A | 10/2000 | Tsai et al. |
| 6,465,832 | B1 | 10/2002 | Maeda et al. |
| 6,808,989 | B2 | 10/2004 | Hurley et al. |
| 7,915,132 | B2 | 3/2011 | Barth et al. |
| 7,977,151 | B2 | 7/2011 | Shieh et al. |
| 8,129,720 | B2 | 3/2012 | Shieh et al. |
| 8,216,948 | B2 | 7/2012 | Moon |
| 8,502,322 | B2 * | 8/2013 | Nitta .............................. 257/390 |
| 2009/0146322 | A1 | 6/2009 | Weling et al. |
| 2010/0178773 | A1 | 7/2010 | Oh et al. |
| 2011/0248385 | A1 * | 10/2011 | Zhu et al. ...................... 257/618 |

(Continued)

FOREIGN PATENT DOCUMENTS

| KR | 1020060135126 A | 12/2006 |
| KR | 1020090066925 A | 6/2009 |

(Continued)

*Primary Examiner* — Telly Green
*Assistant Examiner* — Damian A Hillman
(74) *Attorney, Agent, or Firm* — F. Chau & Associates, LLC

(57) ABSTRACT

To fabricate patterns of a semiconductor device, a mask film is formed on a substrate. A plurality of first patterns and a plurality of second patterns are formed on the mask film. The plurality of first patterns is spaced apart from each other at a first distance. The plurality of second patterns is spaced apart from each other at a second distance. The second distance is different from the first distance. A spacer film is conformally formed on the plurality of first patterns and the plurality of second patterns to a predetermined thickness. The spacer film fills spaces between the plurality of second patterns. A part of the spacer film is partially removed to form a plurality of spacer film patterns are formed on side walls of the plurality of the first patterns. The plurality of first patterns and the plurality of second patterns are removed. A plurality of patterns is formed on the substrate using the plurality of spacer film as a mask.

15 Claims, 11 Drawing Sheets

(56) References Cited

U.S. PATENT DOCUMENTS

2012/0043661 A1 2/2012 Lindsay
2012/0142194 A1* 6/2012 Hwang .................... 438/703
2013/0157437 A1* 6/2013 Yanai et al. .................. 438/424

FOREIGN PATENT DOCUMENTS

KR   1020110052044 A   5/2011
KR   1020120004712 A   1/2012

* cited by examiner

US 9,093,378 B2

METHOD FOR FORMING PATTERNS OF SEMICONDUCTOR DEVICE USING SADP PROCESS

TECHNICAL FIELD

The present inventive concept relates to a method for forming patterns of a semiconductor device.

DISCUSSION OF RELATED ART

As the density of semiconductor devices increases, the line width of patterns of the semiconductor devices has become more fine. A lithography process is needed to fabricate semiconductor devices having fine patterns.

Korean Patent Publication No. 2010-0051361 discloses a method of forming a capacitor of a semiconductor memory device.

SUMMARY

According to an exemplary embodiment of the inventive concept, to fabricate patterns of a semiconductor device, a mask film is formed on a substrate. A plurality of first patterns and a plurality of second patterns are formed on the mask film. The plurality of first patterns is spaced apart from each other at a first distance. The plurality of second patterns is spaced apart from each other at a second distance. The second distance is different from the first distance. A spacer film is conformally formed on the plurality of first patterns and the plurality of second patterns to a predetermined thickness. The spacer film fills spaces between the plurality of second patterns. A part of the spacer film is partially removed to form a plurality of spacer film patterns are formed on side walls of the plurality of the first patterns. The plurality of first patterns and the plurality of second patterns are removed. A plurality of patterns is formed on the substrate using the plurality of spacer film as a mask.

According to an exemplary embodiment of the inventive concept, to fabricate patterns of a semiconductor device, a mask film is formed on a substrate. A plurality of patterns is formed on the mask film. A spacer film is formed on the plurality of patterns. The spacer film is conformally formed on the plurality of patterns and fills spaces between the plurality of patterns. The spacer film is partially removed to form a plurality of spacer film patterns on corresponding side walls of the plurality of patterns. The plurality of patterns is removed. The mask film is removed using the plurality of spacer film patterns as a mask.

According to an exemplary embodiment of the inventive concept, to fabricate metal patterns of a semiconductor device, a plurality of first patterns and a plurality of second patterns are formed on a substrate. The plurality of first patterns is spaced apart from each other at a first distance and the plurality of second patterns is spaced apart from each other at a second distance. A plurality of first spacer film patterns is formed on both side walls of each of the plurality of first patterns to a first thickness. The plurality of first patterns is removed, thereby forming a plurality of trenches exposing an upper surface of the substrate. A metal layer is formed in the plurality of trenches. A plurality of metal patterns is formed by planarizing the metal layer until the plurality of metal patterns has a predetermined thickness, wherein the plurality of metal patterns are spaced apart from each other at a third distance.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
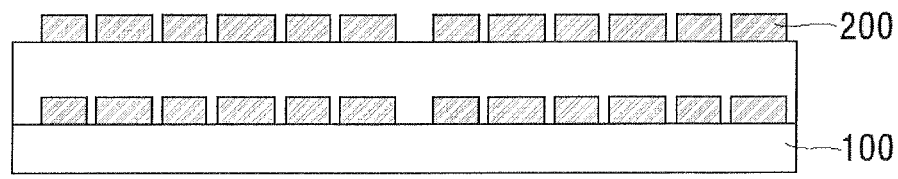
FIG. 1 shows a part of a VNCAP (Vertical Natural Capacitor) that is formed using a method for forming patterns of a semiconductor device according to an exemplary embodiment of the present inventive concept.

Exemplary embodiments of the inventive concept will be described below in more detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

A method for forming patterns of a semiconductor device to be described hereinafter relates to a SADP (Self-Aligned Double Patterning) process that provides various distances between the patterns of the semiconductor device. According to an embodiment of the inventive concept, the SADP process includes two-step patterning processes in forming specific patterns of the semiconductor device. The SADP process may enable photolithographic equipments to form patterns of which a pitch (i.e., the center-to-center distance between identical patterns) is less than what the photolithographic equipments are capable of in a single step patterning process. For example, in forming a mask pattern, a pattern having a fine line width may be formed using the SADP process. The SADP process according to an embodiment enables patterns having less than a minimum fixed pitch to be patterned. The minimum pitch is defined as a "1× pitch". For example, the 1× pitch is defined to have a pattern of 24 nm and a spacer of 24 nm or to form a pattern having a 3× pitch using a block mask. According to the present inventive concept, a method for forming patterns having various pitches from the 1× pitch to the 3× pitch is provided. The 1× pitch is not limited thereto in size, but may be smaller.

FIG. 1 shows a part of a VNCAP that is formed using a method for forming patterns of a semiconductor device according to an embodiment of the present inventive concept.

The SADP process may be used to pattern an electrode of a capacitor 200 on a substrate 100. However, since the SADP process has a fixed space CD (Critical Dimension), a method for forming patterns having pitches from the 1× pitch to the 3× pitch will be described hereinafter.

FIGS. 2 to 11 show intermediate steps of a method for forming patterns of a semiconductor device according to an embodiment of the present inventive concept.

Figure 2:
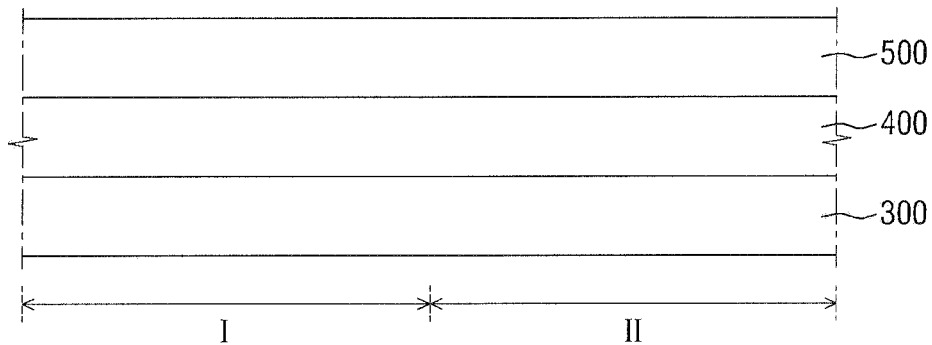
FIGS. 2 to 11 show intermediate steps of a method for forming patterns of a semiconductor device according to an exemplary embodiment of the present inventive concept.

Referring to FIG. 2, the semiconductor device includes a first region I and a second region II. A to-be-etched film 400 and a mask film 500 are sequentially formed, in the first region I and the second region II, on a substrate 300.

The substrate 300 may include Si, Ge, SiGe, GaP, GaAs, SiC, SiGeC, InAs, or InP. Alternatively, the substrate 300 may be of a SOI (Silicon On Insulator) substrate or a GOI (Germanium On Insulator) substrate. Further, the substrate 300 may be of a rigid substrate, such as a glass substrate for display, or a flexible plastic substrate including polyimide, polyester, polycarbonate, polyethersulfone, polymethylmethacrylate, polyethylene naphthalate, or polyethyleneterephthalate.

Other structures (not shown) may be formed on the substrate 300. For example, a conductive film (not shown) including metal, metal nitride, or metal silicide, a conduction structure such as an electrode (not shown), or an insulating film (not shown) may be formed. The to-be-etched film 400 may be formed on the substrate 300, but in the case where the substrate 300 may be etched, the etched film 400 is not formed on the substrate 300.

The to-be-etched film 400 may be formed by performing a CVD (Chemical Vapor Deposition) process, a PECVD (Plasma Enhanced CVD) process, a spin coating process, or a HDP-CVD (High Density Plasma-Chemical Vapor Deposition) process using PSG (Phosphor Silicate Glass), BPSG (Boro-Phosphor Silicate Glass), USG (Undoped Silicate Glass), TEOS (Tetra Ethyl Ortho Silicate), PE-TEOS (Plasma Enhanced-TEOS), HDP-CVD oxide, porous oxide or silicon nitride, such as LK (Low-K) or ULK (Ultra Low-K) dielectric material used in a BEOL (Back-End Of Line) process.

The mask film 500 is formed on the to-be-etched film 400. In the case where the to-be-etched film 400 does not exist on the substrate 300, the mask film 500 may be formed on the substrate 300. The mask film 500 may include a material having etch selectivity against the to-be-etched film 400 or the substrate 300. For example, the mask film 500 may include a material that is resistant to an etch process of the to-be-etched film 400 or the substrate 300. The mask film 500 may be formed by depositing silicon oxide through a PECVD process. The mask film 500 may be formed using a silicon based spin-on hard mask (Si—SOH) such as spin-on glass (SOG). A reflection prevention film (not shown) may be further formed on the mask film 500. The reflection prevention film may be formed through a CVD process using silicon oxynitride (SiON).

Figure 3:
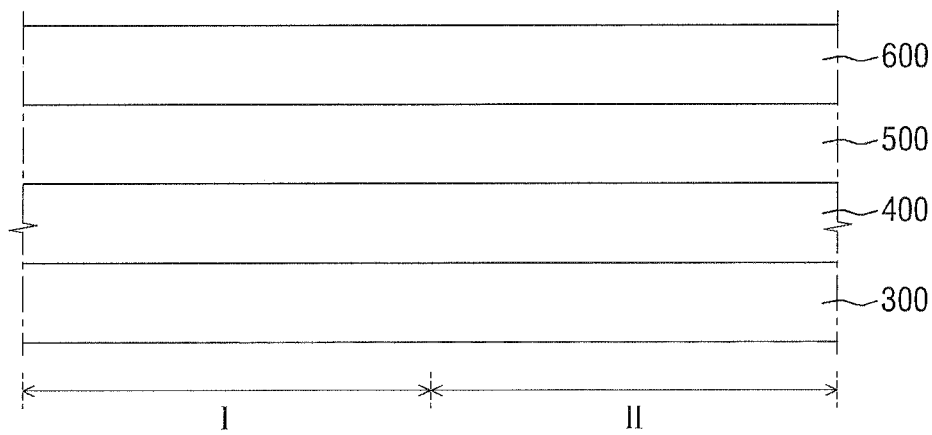
Figure 4:
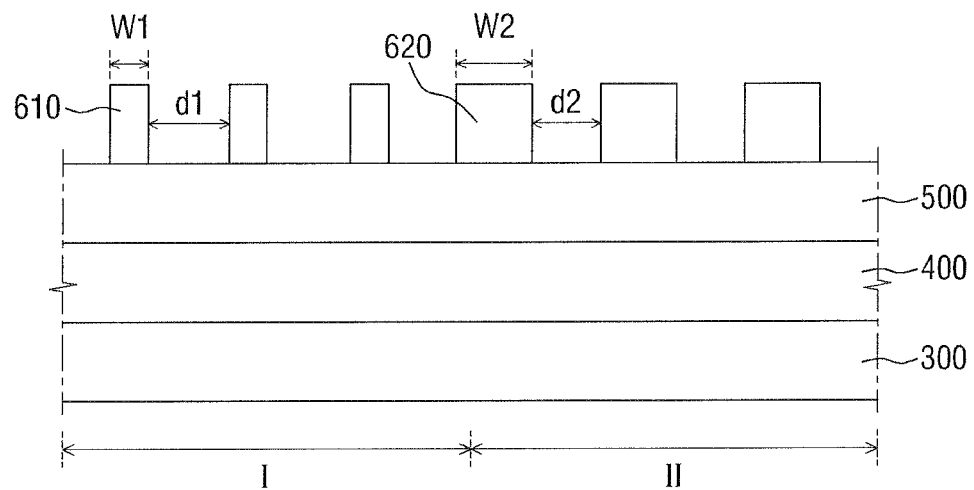

Referring to FIGS. 3 and 4, first patterns 610 and second patterns 620 are formed on the mask film 500. The first patterns 610 are positioned in the first region I, and the second patterns 620 are positioned in the second region II. In this case, the first patterns 610 include a first distance d1 between the first patterns 610, and the second patterns 620 include a second distance d2 between the second patterns 620. The first distance is greater than the second distance d2. Each of the first patterns 610 has a width W1. Each of the second patterns 620 has a width W2. According to an embodiment, the width W1 is smaller than the width W2. According to an exemplary embodiment, the first distance d1 is substantially three times the width W1, and the second distance d2 is substantially equal to the width W2. In addition, the second width W2 is substantially two times the first width W1. For example, when the semiconductor device includes a CD of about 24 nm, the width W1 is about 24 nm; the first distance d1 is 72 nm; and the second distance d2 and the width W2 is about 48 nm. Accordingly, the pitch P, in the region I, is about 96 nm, where the pitch P has the size of the sum of the width W1 and the first distance d1 that is three times the width W1. In the region II, the pitch P has the size of the sum of the width W2 and the second distance d2.

The first patterns 610 and the second patterns 620 may be formed by forming a photoresist pattern (not shown) on a pattern layer 600 and etching the pattern layer 600 using the photoresist pattern as an etching mask. The pattern layer 600 may include a carbon-spin on hardmask material including about 99% of carbon. For example, the first patterns 610 and the second patterns 620 may be formed by spin-coating the carbon-spin on hardmask material on the mask film 500 and then hardening the carbon-spin on hardmask material through baking at a temperature of about 350° C. to about 450° C. On the first patterns 610 and the second patterns 620, the reflection prevention film (not shown) may be formed. However, for simplification of the process, forming of the reflection prevention film may be omitted. The reflection prevention film may serve to minimize reflection between the substrate and a photoresist film to be formed in the following process. The reflection prevention film may include silicon oxynitride formed by a CVD process.

Figure 5:
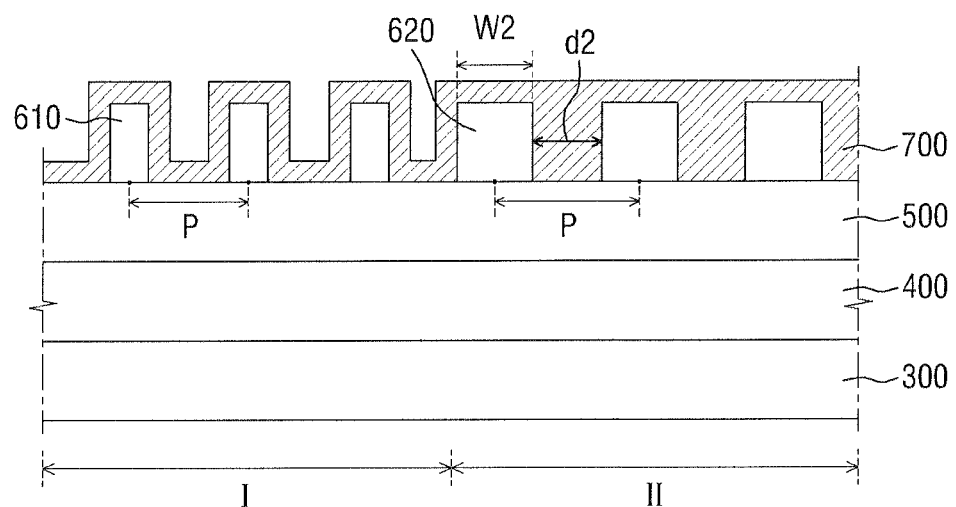

Referring to FIG. 5, a preliminary spacer film 700 is conformally formed on the first patterns 610 and the second patterns 620. In this case, the preliminary spacer film 700 has a predetermined thickness of the CD. When the CD is about 24 nm and the pitch P is about 96 nm as explained above, the preliminary space film 700 has a thickness of the CD—i.e., 24 nm. The preliminary space film 700 formed in the second region II fills spaces between the second patterns 620. For example, the preliminary space film 700 has the thickness of about 24 nm, so the combined thickness of the preliminary space film 700 that is formed in the spaces between the second patterns 620 amounts to 48 nm, which is substantially equal to the second distance d2. The preliminary space film 700, formed in the first region I, forms a space between the first patterns 610 and the space has a width of 24 nm.

The preliminary spacer film 700 may include a material having etch selectivity against the first patterns 610 and the second patterns 620. For example, the spacer film 700 may include silicon oxide, such as middle temperature oxide (MTO), high temperature oxide (HTO), or ALD oxide.

Figure 6:
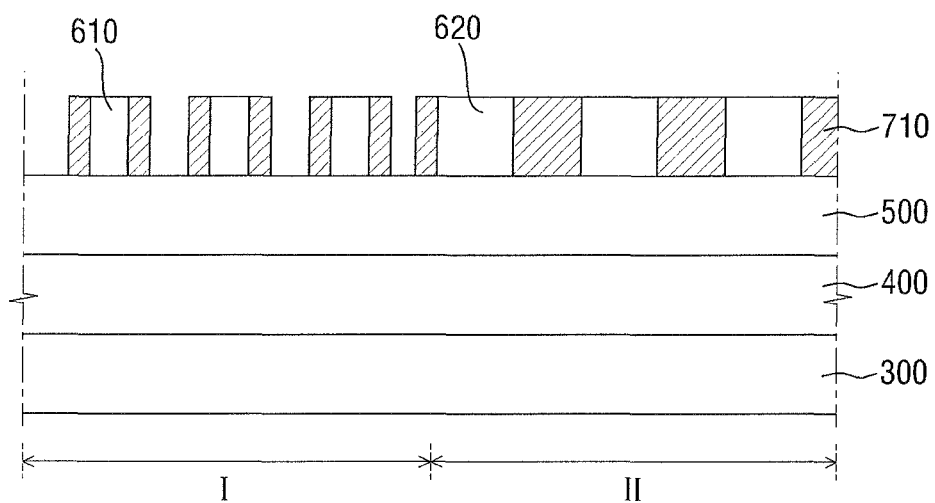

Referring to FIG. 6, a part of the preliminary spacer film 700 of FIG. 5 is removed using an etch back process. For example, the preliminary spacer film 700, after the etch back process, remains on side walls of the first patterns 610 and the second patterns 620, thereby forming spacer film patterns 710. Removed is the preliminary spacer film 700 formed on upper surfaces of the first patterns 610, on upper surfaces of the second patterns 620, and on a part of an upper surface of the mask film 500.

Figure 7:
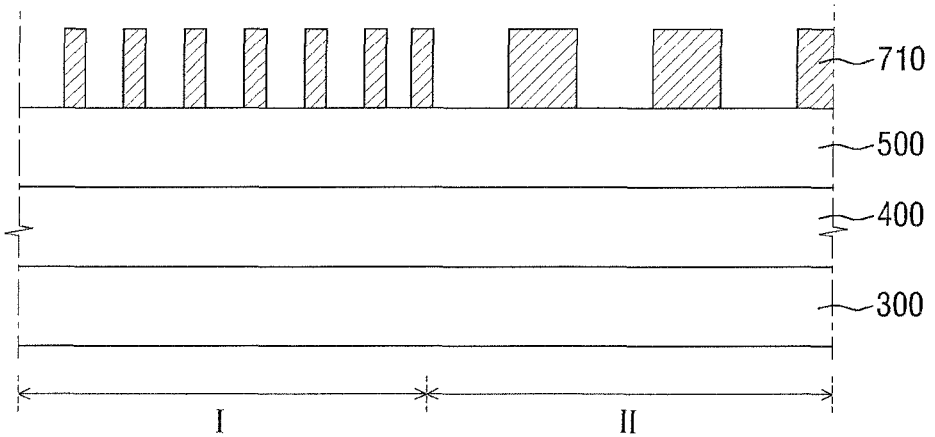

Referring to FIG. 7, the first patterns 610 and the second patterns 620 are removed. The spacer film patterns 710 may include a material having etch selectivity against the first patterns 610 and the second patterns 620. The first patterns 610 and the second patterns 620 are removed using an etchant which selectively etches the first patterns 610 and the second patterns 620, but scarcely etch the spacer film patterns 710. Accordingly, two spacer film patterns 710 are formed in the pitch P of the first region I and the distance between the two spacer film patterns 710 is the size of the CD—i.e., 24 nm.

Figure 8:
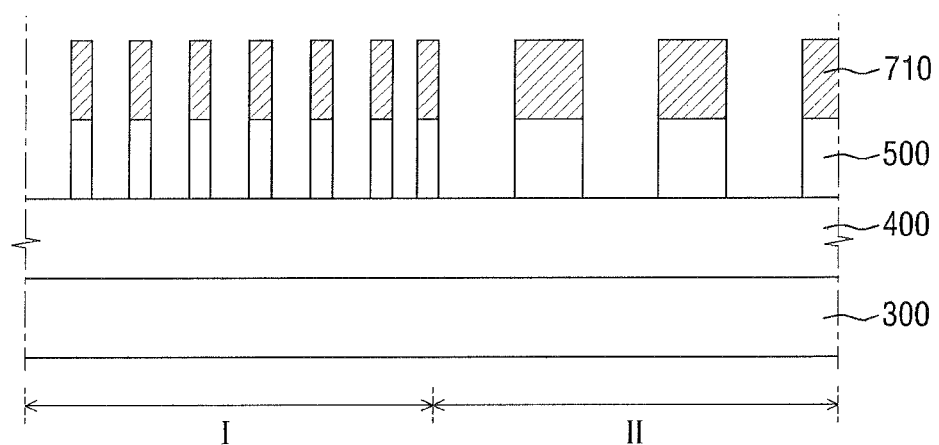
Figure 9:
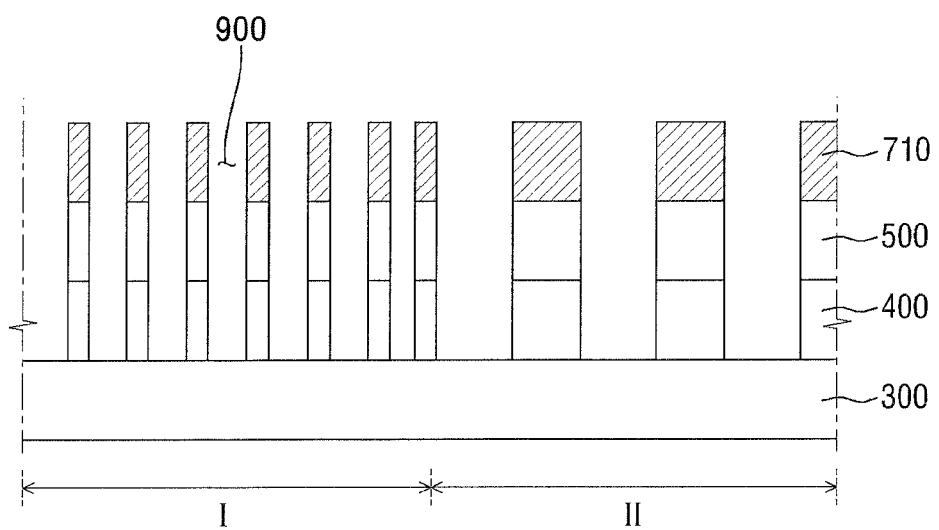

Referring to FIGS. 8 and 9, the mask film 500 and the to-be-etched film 400 are sequentially removed to form trenches 900 that expose corresponding upper surfaces of the substrate. For example, using the spacer film pattern 710 as a mask, the mask film 500 and the to-be-etched film 400 are sequentially patterned by a etching process. The trenches 900 are defined by spaces between stacked patterns of the spacer film patterns 710, the remaining mask film 500, and the remaining to-be-etched film 400. The trenches 900 expose corresponding upper surfaces of the substrate.

Figure 10:
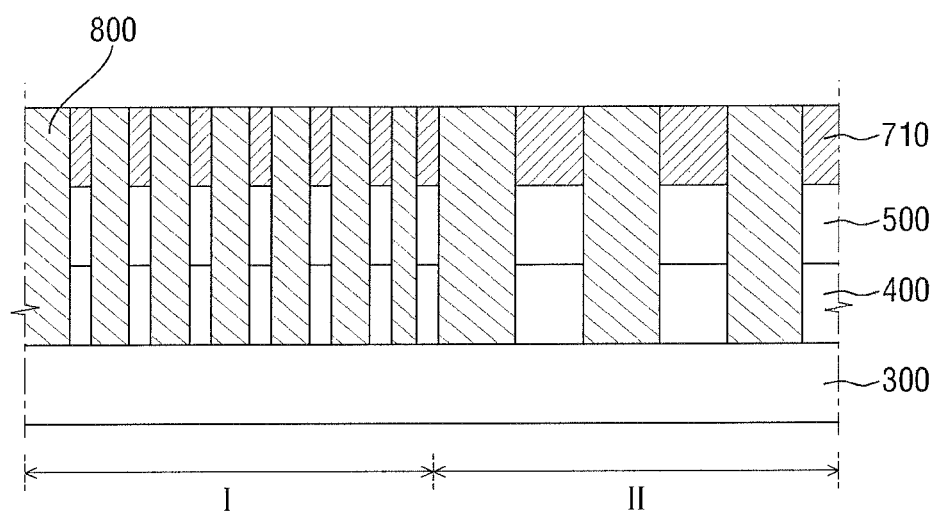

Referring to FIG. 10, a metal material 800 fills the trenches 900. The metal material 800 may include, for example, Cu.

Figure 11:
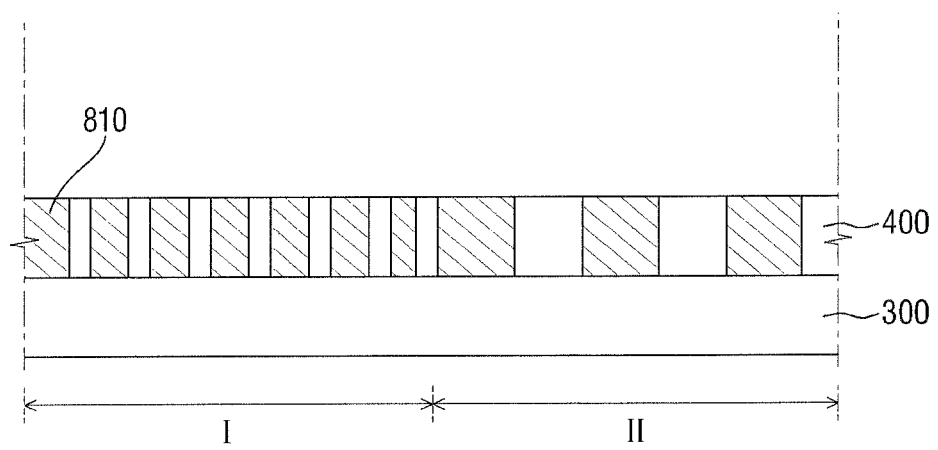

Referring to FIG. 11, metal patterns 810 are formed by removing an upper portion of the etched film 400. The upper portion of the etched film 400 may be removed using a planarization process (for example, a CMP process). According to an exemplary embodiment, the metal patterns 810 include two distances including a third distance d3 and the fourth distance d4. The third distance d3 is one between two metal patterns 810 of the first region I, and is substantially the same with the width W1. The fourth distance d4 is one between two metal patterns 810 of the second region II, and is substantially the same with the width W2.

Hereinafter, referring to FIGS. 12 to 19, a method for forming patterns of a semiconductor device according to an exemplary embodiment of the present inventive concept will be described.

FIGS. 12 to 19 show intermediate steps of forming patterns of a semiconductor device according to an exemplary embodiment of the present inventive concept. For convenience of explanation, explanation of the same elements in the embodiment described above will be omitted or briefly made here.

Figure 12:
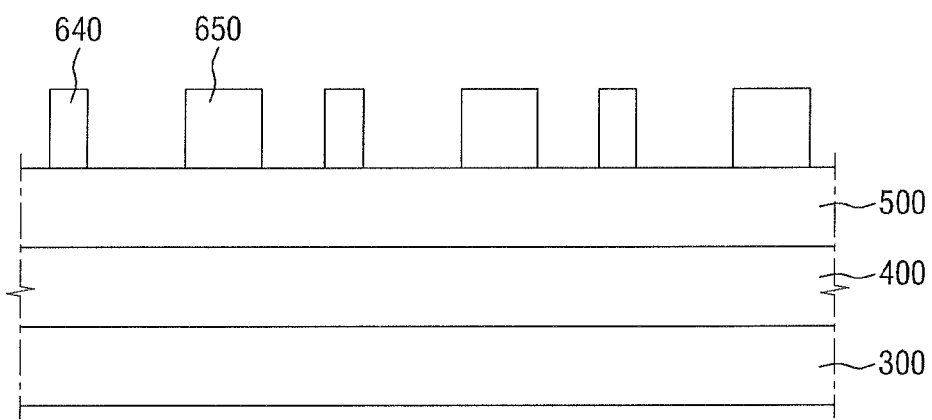
FIGS. 12 to 19 show intermediate steps of a method for forming patterns of a semiconductor device according to an exemplary embodiment of the present inventive concept.

Referring to FIG. 12, an to-be-etched film 400 and a mask film 500 are sequentially formed on a substrate 300. Then, patterns 640 and 650 are formed on the mask film 500.

The patterns 640 and 650 may be spaced apart at various distances. Further, each of the patterns 640 and 650 may have various widths. The patterns 640 and 650 may be formed from a pattern layer 600 as shown in FIG. 3 by a photolithography process For example, the patterns 640 and 650 may be formed by spin-coating the carbon-spin on hardmask material on the mask film 500 and then hardening the carbon-spin on hardmask material through baking at a temperature of 350° C. to 450° C. On the patterns 640 and 650, a reflection prevention film (not shown) may be formed. However, for simplification of the process, forming of the reflection prevention film may be omitted. The reflection prevention film may serve to minimize reflection between the substrate and a photoresist film to be formed in the following process. The reflection prevention film may include silicon oxynitride formed by a CVD process.

Figure 13:
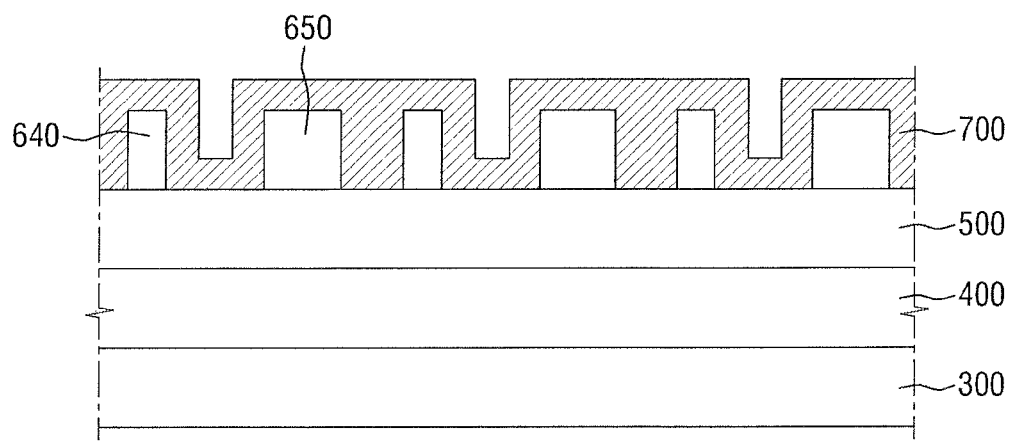

Referring to FIG. 13, a preliminary spacer film 700 is formed on the patterns 640 and 650. The spacer film 700 may be conformally formed on the patterns 640 and 650 to fill spaces between the remaining patterns.

The preliminary spacer film 700 may include a material having etch selectivity against the patterns 640 and 650. For example, the preliminary spacer film 700 may include silicon oxide, such as middle temperature oxide (MTO), high temperature oxide (HTO), or ALD oxide.

Figure 14:
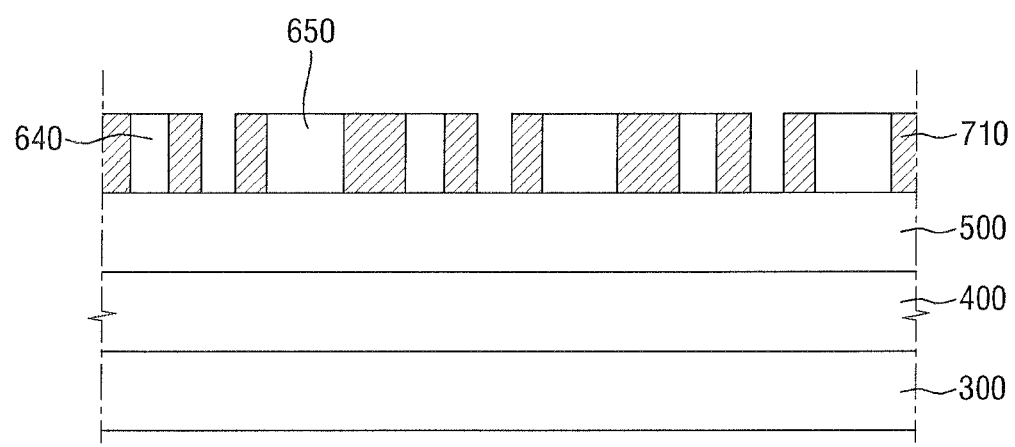

Referring to FIG. 14, the preliminary spacer film 700 is partially removed by an etch back process to form spacer film patterns 710. For example, the etch back process removes the spacer film formed both on upper surfaces of the patterns 640 and 650 and on a part of an upper surface of the mask film 500, except the spacer films 700 formed on side walls of the patterns 640 and 650.

Figure 15:
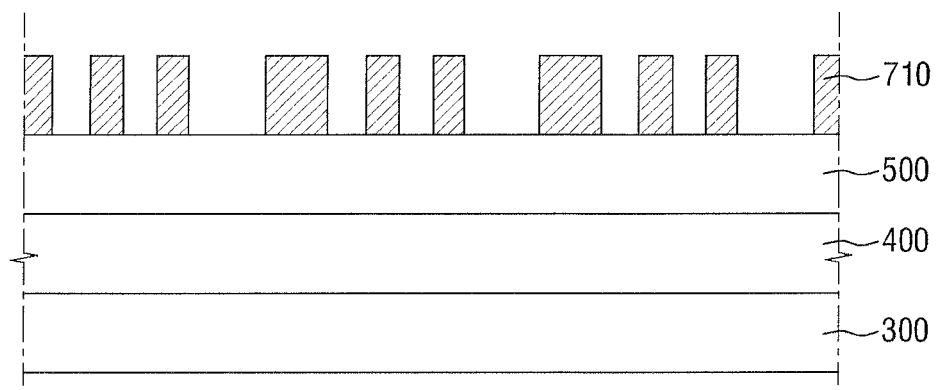

Referring to FIG. 15, the patterns 640 and 650 are removed. The spacer film patterns 710 may include a material having etch selectivity against the patterns 640 and 650. Accordingly, the patterns 640 and 650 may be removed using an etchant which etches the patterns 640 and 650, but does not etch the spacer film patterns 710.

Figure 16:
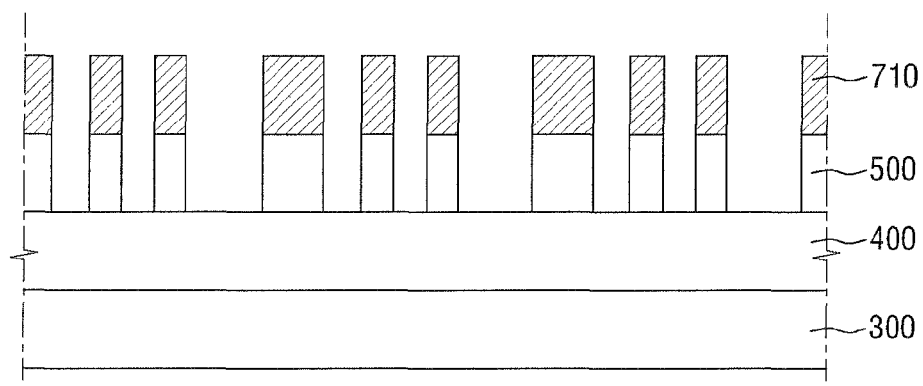
Figure 17:
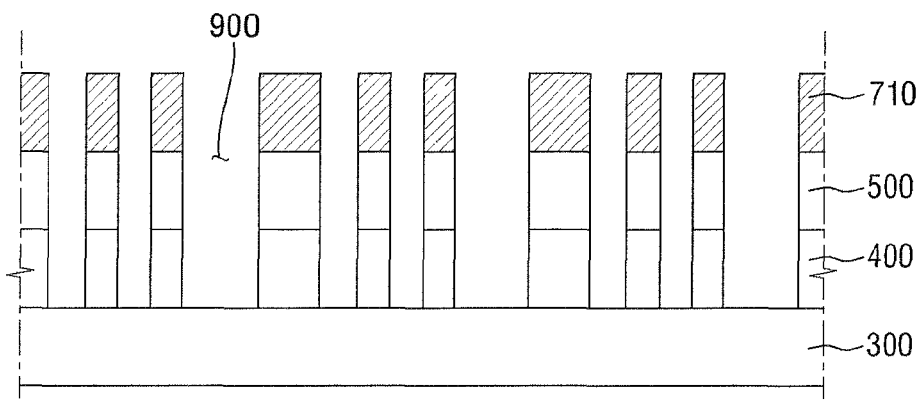

Referring to FIGS. 16 and 17, the mask film 500 and the etched film 400 are sequentially patterned to form trenches 900 that expose corresponding upper surfaces of the substrate. For example, using the remaining spacer film 700 as a mask, the mask film 500 and the etched film 400 are sequentially removed by an etching process. The trenches 900 are defined by spaces between stacked patterns of the spacer film patterns 710, the remaining mask film 500, and the remaining to-be-etched film 400. The trenches 900 expose corresponding upper surfaces of the substrate 300.

Figure 18:
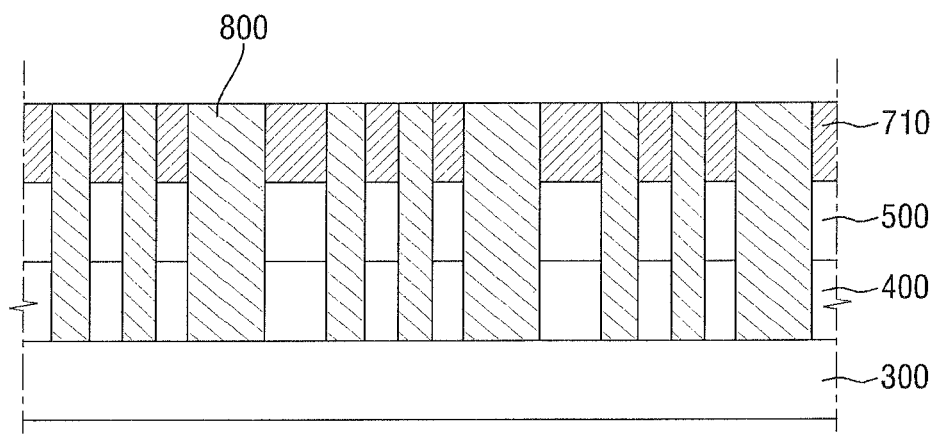

Referring to FIG. 18, a metal material 800 fills the trenches 900. The metal material 800 may include, for example, Cu.

Figure 19:
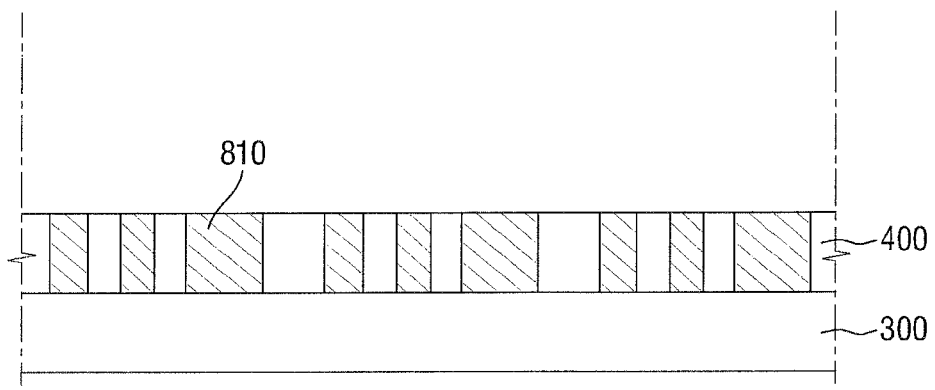

Referring to FIG. 19, metal patterns 810 are formed by removing an upper portion of the to-be-etched film 400. The upper portion of the to-be-etched film 400 may be removed by using a planarization process (for example, CMP process).

According to an embodiment of the present inventive concept, a SADP process enables patterns of a semiconductor device to have various distances between the patterns. For example, the metal patterns 810 may be spaced apart at various distances, depending on the widths of and distances between the patterns 640 and 650.

Figure 20:
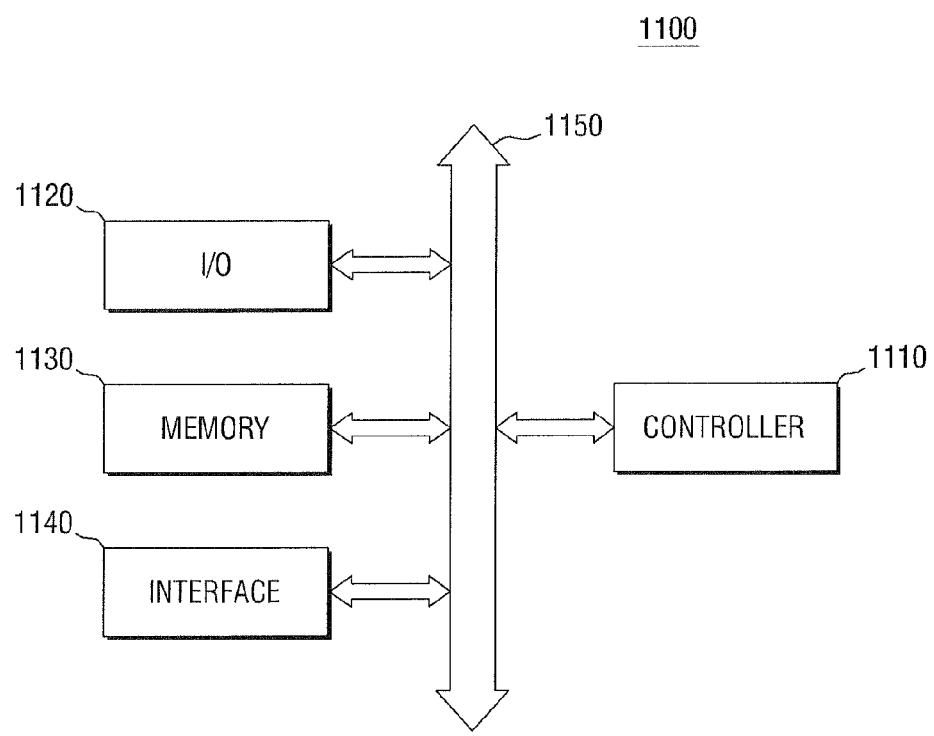
FIG. 20 shows a block diagram of an electronic system including a semiconductor device that is formed according to some embodiments of the present inventive concept.

FIG. 20 shows a block diagram of an electronic system including a semiconductor device formed according to some embodiments of the present inventive concept.

Referring to FIG. 20, an electronic system 1100 according to an embodiment of the present inventive concept may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include a microprocessor, a digital signal processor, a microcontroller, and/or logic elements. The logic elements may perform similar functions to a microprocessor, a digital signal processor or a microcontroller. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. The electronic system 1100 may further include a high-speed DRAM and/or SRAM as an operating memory (not shown) for improving the operation of the controller 1110.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 21:
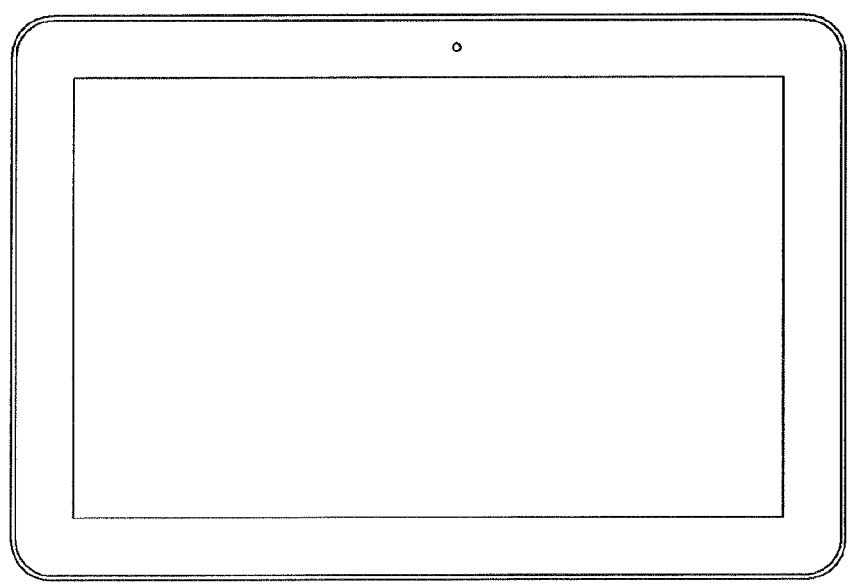
FIGS. 21 and 22 show a semiconductor system including a semiconductor device formed according to some embodiments of the present inventive concept.
Figure 22:
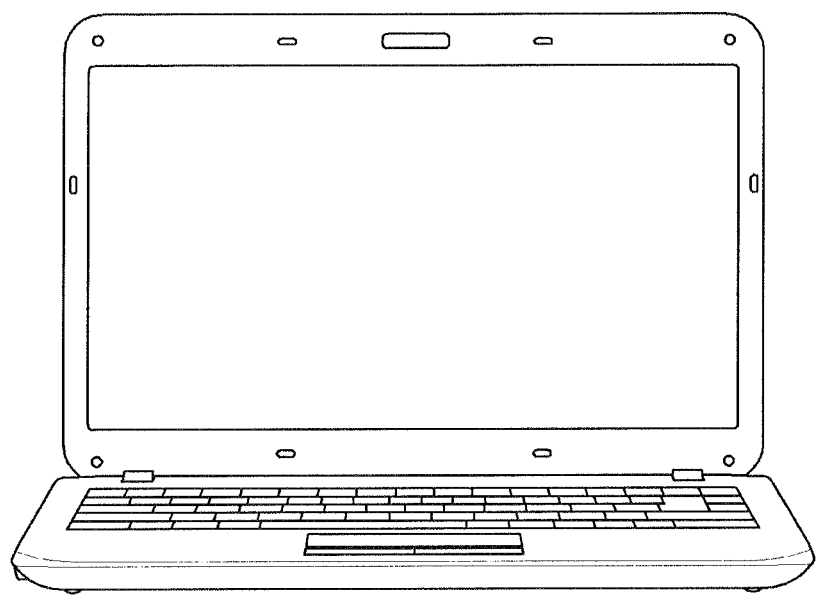

FIGS. 21 and 22 show a semiconductor system including a semiconductor device according to some embodiments of the present inventive concept. FIG. 21 shows a tablet PC, and FIG. 22 shows a notebook PC. The tablet PC and the notebook include at least one semiconductor devices according to embodiments of the present inventive concept.

While the present inventive concept has been shown and described with reference to exemplary embodiments thereof, it will be apparent to those of ordinary skill in the art that various changes in form and detail may be made therein without departing from the sprit and scope of the inventive concept as defined by the following claims.

What is claimed is:

1. A method for forming patterns of a semiconductor device, comprising:
    forming a mask film on a substrate;
    forming a plurality of first patterns and a plurality of second patterns on the mask film, wherein the plurality of first patterns is substantially equally spaced apart from each other at a first distance, and the plurality of second patterns is substantial equally spaced apart from each other at a second distance different from the first distance;
    conformally forming a spacer film on the plurality of first patterns and the plurality of second patterns to a predetermined thickness, wherein the spacer film completely fills spaces between two adjacent second patterns of the plurality of second patterns and the spacer film partially fills spaces between the plurality of first patterns;
    removing a part of the spacer film, thereby forming a plurality of spacer film patterns on side walls of the plurality of first patterns;
    removing the plurality of first patterns and the plurality of second patterns; and
    forming a plurality of patterns on the substrate by etching the mask film using the plurality of spacer film patterns as a mask.

2. The method for forming patterns of a semiconductor device of claim 1, wherein the first distance is greater than the second distance.

3. The method for forming patterns of a semiconductor device of claim 2, wherein the second distance is about 48 nm.

4. The method for forming patterns of a semiconductor device of claim 2, wherein a width of the first pattern is less than a width of the second pattern.

5. The method for forming patterns of a semiconductor device of claim 4, wherein the width of the second pattern is about 48 nm and the width of the first pattern is about 24 nm.

6. The method for forming patterns of a semiconductor device of claim 5, wherein a thickness of the spacer film is about 24 nm.

7. The method for forming patterns of a semiconductor device of claim 1, wherein the removing the plurality of first patterns and the plurality of second patterns is performed using an etchant having etch selectivity against, the spacer film.

8. The method for forming patterns of a semiconductor device of claim 1, wherein the plurality of first patterns and the plurality of second patterns include carbon.

9. The method for forming patterns of a semiconductor device of claim 1, further comprising forming an to-be-etched film between the substrate and the mask film.

10. The method for forming patterns of a semiconductor device of claim 1, wherein the removing a part of the spacer film is performed using an etch back process.

11. A method of forming metal patterns of a semiconductor device comprising:
    forming a plurality of first patterns and a plurality of second patterns on a substrate, wherein the plurality of first patterns is substantially equally spaced apart from each other at a first distance and the plurality of second patterns is substantially equally spaced apart from each other at a second distance;
    forming a plurality of first spacer film patterns on both side walls of each of the plurality of first patterns to a first thickness;
    removing the plurality of first patterns, thereby forming a plurality of trenches exposing an upper surface of the substrate;
    forming a metal layer in the plurality of trenches; and
    forming a plurality of metal patterns by planarizing the metal layer until the plurality of metal patterns has a predetermined thickness, wherein the plurality of metal patterns are spaced apart from each other at a third distance.

12. The method of forming metal patterns of a semiconductor device of claim 11, wherein each of the plurality of first patterns has a first width and each of the plurality of second patterns has a second width and wherein the second width is substantially two times the first width.

13. The method of forming metal patterns of a semiconductor device of claim 12, wherein the third distance is substantially the same with the first width.

14. The method of forming metal patterns of a semiconductor device of claim 12, wherein the first distance is substantially three times the first width, and the second width is substantially two times the first width.

15. The method of forming metal patterns of a semiconductor device of claim 14, wherein the first thickness is substantially the same with the first width.

* * * * *